United States Patent
Whitecar

Patent Number: 6,055,318
Date of Patent: Apr. 25, 2000

[54] ADAPTIVE NOISE REDUCTION FILTER WITH LOW MODULATION DISABLING

[75] Inventor: John Elliott Whitecar, Plymouth, Mich.

[73] Assignee: Ford Motor Company, Dearborn, Mich.

[21] Appl. No.: 09/074,531

[22] Filed: May 7, 1998

[51] Int. Cl.$^7$ .................................................. H04B 15/00
[52] U.S. Cl. .................. 381/94.2; 381/71.1; 381/71.11; 381/71.12; 708/322
[58] Field of Search .................................. 381/71.1, 94.1, 381/71.12, 71.11, 2, 71.14, 94.2, 94.3, 94.9, 98, 101, 102, 106, 108; 708/322

[56] References Cited

U.S. PATENT DOCUMENTS

| | | |
|---|---|---|
| 3,678,416 | 7/1972 | Burwen . |
| 3,753,159 | 8/1973 | Burwen . |
| 3,889,108 | 6/1975 | Cantrell . |
| 4,322,641 | 3/1982 | Packard . |
| 4,622,520 | 11/1986 | Kuroda . |
| 4,761,829 | 8/1988 | Lynk, Jr. et al. . |
| 5,070,527 | 12/1991 | Lynn ..................................... 379/395 |
| 5,097,221 | 3/1992 | Miller . |
| 5,278,780 | 1/1994 | Eguchi . |
| 5,339,455 | 8/1994 | Vogt et al. . |
| 5,371,695 | 12/1994 | Baraszu . |
| 5,396,561 | 3/1995 | Popovich et al. ........................ 381/71 |
| 5,432,854 | 7/1995 | Honjo et al. . |
| 5,465,406 | 11/1995 | Whitecar et al. . |
| 5,465,410 | 11/1995 | Hiben et al. . |
| 5,649,321 | 7/1997 | Kellenberger . |

Primary Examiner—Forester W. Isen
Assistant Examiner—Ai Nguyen
Attorney, Agent, or Firm—Mark Mollon

[57] ABSTRACT

An infinite impulse response (IIR) lowpass filter is placed in the audio path of an audio system wherein the upper cutoff frequency of the filter is adaptively controlled based on a comparison between the average audio signal entering the filter and the average audio signal leaving the filter. An adaptive LMS process is used to control the filter bandwidth so that the average output signal reaches a predefined percentage of the average input signal. An adaptation rate is selected depending on whether the filter bandwidth needs to increase or decrease. Adaptation is fastest for increasing bandwidth and slowest for decreasing filter bandwidth to prevent audible breathing and loss of high frequency information on sudden signal transients. Adaptation is disabled (at least to the extent that decreasing of the filter bandwidth is disabled) whenever low signal modulation is detected.

4 Claims, 3 Drawing Sheets

ADAPTIVE NOISE REDUCTION FILTER WITH LOW MODULATION DISABLING

The present application is related to copending application Ser. No. (97-0828), entitled "Adaptive Noise Reduction Filter with Continuously Variable Sliding Bandwidth".

BACKGROUND OF THE INVENTION

The present invention relates in general to dynamic noise reduction of an audio signal, and more specifically to an adaptive audio filter having a continuously variable sliding bandwidth to control the energy leaving the audio filter as a fixed percentage of the energy entering the audio filter, wherein the adaptation is disabled under low modulation conditions.

Audio systems, such as radio receivers, have used dynamic noise reduction in an attempt to control background noise when low level audio signals are present or when a radio receiver receives a weak RF signal. In some systems, high frequency content of the demodulated signal is compared with a fixed threshold to detect noise, and a lowpass filter is engaged when high frequency content is above the threshold. Such systems are not effective on all types of broadcast signals and often result in audible "breathing" effects due to the switching in and out of the lowpass filter.

U.S. Pat. No. 3,889,108 issued to Cantrell discloses an adaptive lowpass filter for reducing noise in an audio signal. However, in controlling the adaptive filter, Cantrell divides an expected noise power by an RMS error. Thus, the predetermined known or estimated noise power of the noise signal that will be received is required. In practice, this value may not be subject to accurate estimation. Furthermore, the requirement to perform a division is cumbersome and expensive to implement in digital signal processing (DSP) hardware, as opposed to implementations using only multiply functions. Furthermore, Cantrell compares the difference of instantaneous signals, and thereby inadvertently includes phase difference information in the comparison which is not relevant for determining a desired bandwidth of the filter. The phase difference results in larger error signals which reduces the filter bandwidth farther than desired.

SUMMARY OF THE INVENTION

The present invention has the advantage that an adaptive noise reduction filter is obtained using efficient, simple DSP hardware while obtaining accurate filter tracking to the energy of the audio signal. Furthermore, the present invention avoids having the filter adapt to variations in noise content of a signal by disabling adaptation when low audio signal levels are detected.

In one aspect, the invention provides a method for dynamic noise reduction of an audio signal in an audio reproduction system. The audio signal is lowpass filtered in an adaptive lowpass filter having a plurality of filter coefficients to control an upper cutoff frequency of the lowpass filter. An input audio signal at an input to the adaptive lowpass filer is time averaged to obtain an input average. An output audio signal at an output of the adaptive lowpass filter is time averaged to obtain an output average. One of the averages is multiplied by a percentage constant. A difference is formed between the multiplied average and the other one of the averages to obtain an error. The filter coefficients are adapted to cancel the error. The input average is compared with a low modulation threshold, and at least a portion of the adapting step is inhibited if the input average is below the low modulation threshold.

DETAILED DESCRIPTION OF PREFERRED EMBODIMENTS

Figure 1:
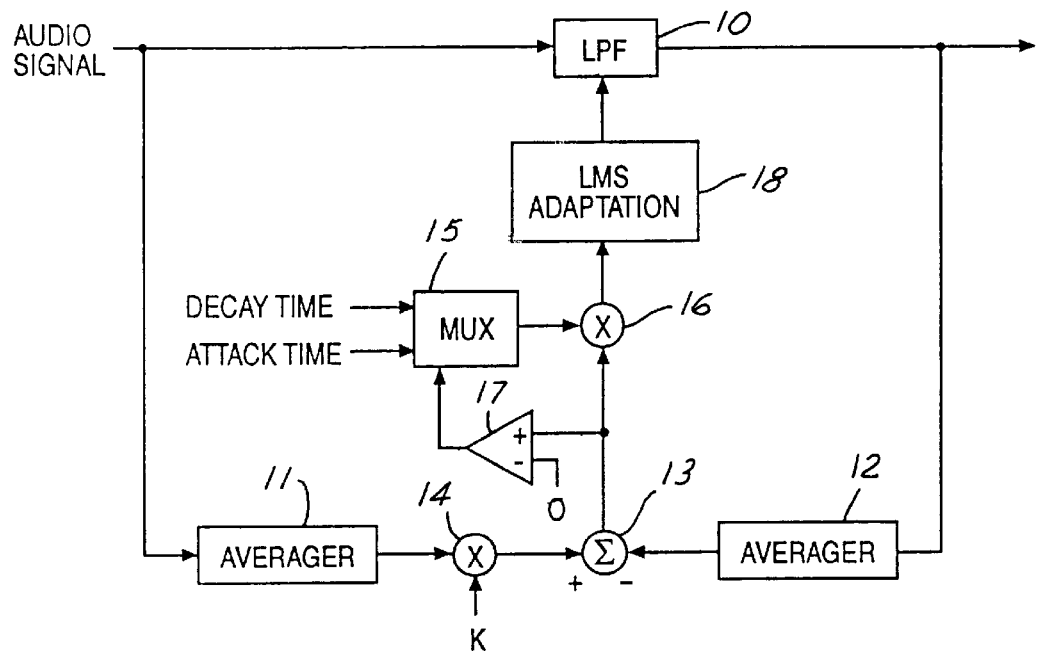
FIG. 1 is a block diagram showing the adaptive noise reduction filter of the present invention.

In FIG. 1, a lowpass filter (LPF) 10 may preferably be comprised of an infinite impulse response (IIR) filter implemented in DSP. LPF 10 includes a plurality of filter coefficients which are adjustable in order to produce a continuously variable sliding upper cutoff frequency. The bandwidth of LPF 10 is controlled to provide an amount of filtering which results in the filter output providing a fixed percentage of the input signal energy. Thus, an audio signal (e.g., resulting from the demodulation of a radio broadcast signal or reproduction from prerecorded media and then digitized) is coupled to the input of LPF 10 and to the input of an input averager 11. Likewise, the output of LPF 10 is connected to the input of an output averager 12 which has its output connected to a subtracting input on a summer 13. The output of input averager 11 is coupled through a multiplier 14 to an adding input of summer 13. A fixed percentage constant k is applied to a second input of multiplier 14 so that summer 13 produces a signal indicating the difference between the average output of LPF 10 and a fixed percentage of the average input to LPF 10. The output of summer 13 thus provides an error signal for correcting the bandwidth of LPF 10.

The rate of adaptation to the existing error is controlled according to either a decay time or an attack time provided through a multiplexer 15 to a multiplier 16. A comparator 17 compares the error signal from summer 13 with zero (i.e. comparator 17 determines the positive or negative sign of the error). The output of comparator 17 controls multiplexer 16 to select the attack time when the error is negative (i.e., when filter bandwidth should be decreased) and selects the decay time when the error is positive (and the filter bandwidth needs to increase). The decay time constant is larger than the attack time constant so that the adaptation rate is fast when increasing the bandwidth and slow when decreasing the bandwidth to prevent audible breathing and loss of high frequency information on sudden transients (e.g., in a radio receiver). The error multiplied by either the decay time or the attack time constant provides an adaptation delta which is provided to an LMS adaptation block 18 for generating adaptive filter coefficients for LPF 10.

Percentage constant k preferably falls in the range of between about 90 and 100%, and most preferably equals about 98%. It has been found that a beneficial signal-to-noise ratio results under most conditions with the adaptive noise reduction filter removing about 2% of the total energy in the audio signal. Alternatively, rather than multiplying the input average, the output average could be multiplied by a constant between 100% and about 110%.

Figure 2:
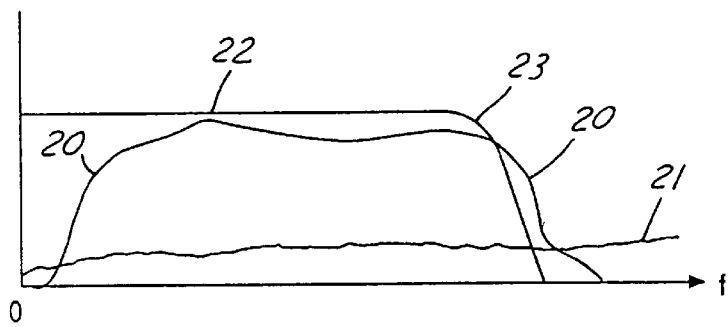
FIG. 2 is a waveform plot showing the relationship between the filter bandwidth and the input signal total energy.
Figure 3:
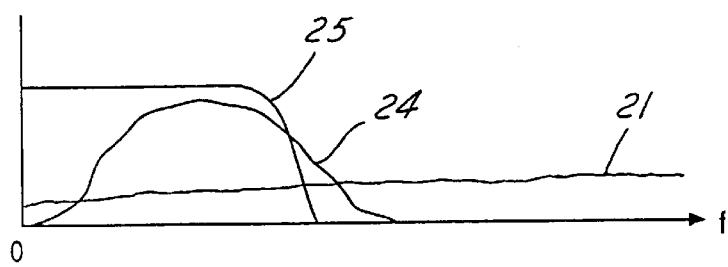
FIG. 3 is a waveform diagram showing the adapted filter bandwidth for a reduced energy and reduced bandwidth input signal.

FIG. 2 shows a frequency spectrum 20 of an audio signal being transmitted through a transmission channel including the audio system, and channel noise 21 which is also present in the transmission channel of the audio system and/or the RF broadcast channel and which adds to the audio signal. The adaptive filter of the present invention automatically configures itself with a filter passband which passes nearly all the original audio signal content while blocking extraneous noise which is separable from the audio signal. Thus, a passband characteristic 22 is automatically achieved having an upper cutoff frequency 23 which dynamically reduces more noise than original signal. Thus, when the audio signal spectrum changes to one having lower frequency content (and less overall energy) as shown at 24 in FIG. 3, the passband of the adaptive lowpass filter reduces to a new upper cutoff frequency at 25. Consequently, the audio signal is passed through the filter with maximum reduction of noise.

The adaptive filter and its operation will be described in greater detail with reference to FIG. 4. The input averager is comprised of an absolute value block 30 providing a rectified audio signal to a lowpass filter 31. Similarly, the output audio signal is provided through an absolute value block 32 to a lowpass filter 33. Lowpass filters 31 and 33 are preferably comprised of butterworth IIR filters having an upper cutoff frequency of about 100 Hz. The difference between the average audio output from LPF 33 and the ratioed input average from multiplier 14 is derived in summer 13. A threshold circuit 34 is a preferred digital implementation of comparator 17 in FIG. 1. Threshold block 34 receives a constant $C_2$ which is preferably equal to zero so that threshold block 34 identifies the positive or negative sign of the difference from summer 13. If the difference is negative (i.e., the output signal average is greater than intended), then threshold block 34 controls multiplexer 15 to switch to an attack time constant $c_2$. Otherwise, multiplexer 15 is switched to decay time constant $c_3$. The product of the error and the attack or delay time constant produces an adaptation delta for adapting the filter.

The adaptive filter of the present invention preferably takes the form of an infinite impulse response (IIR) filter. A second order filter is preferred having the form of $$y_n = b_0(x_n + x_{n-1}) + a_1(y_{n-1})$$

where y is the filter output, x is the filter input and $b_0$ and $a_1$ are the adaptive filter coefficients. In order to ensure that the filter coefficients track one another to provide unity gain in the filter, a relationship between the filter coefficient preferably exists as follows:

$$a_1 = (0.5 - b_0) \times 2.$$

Figure 4:
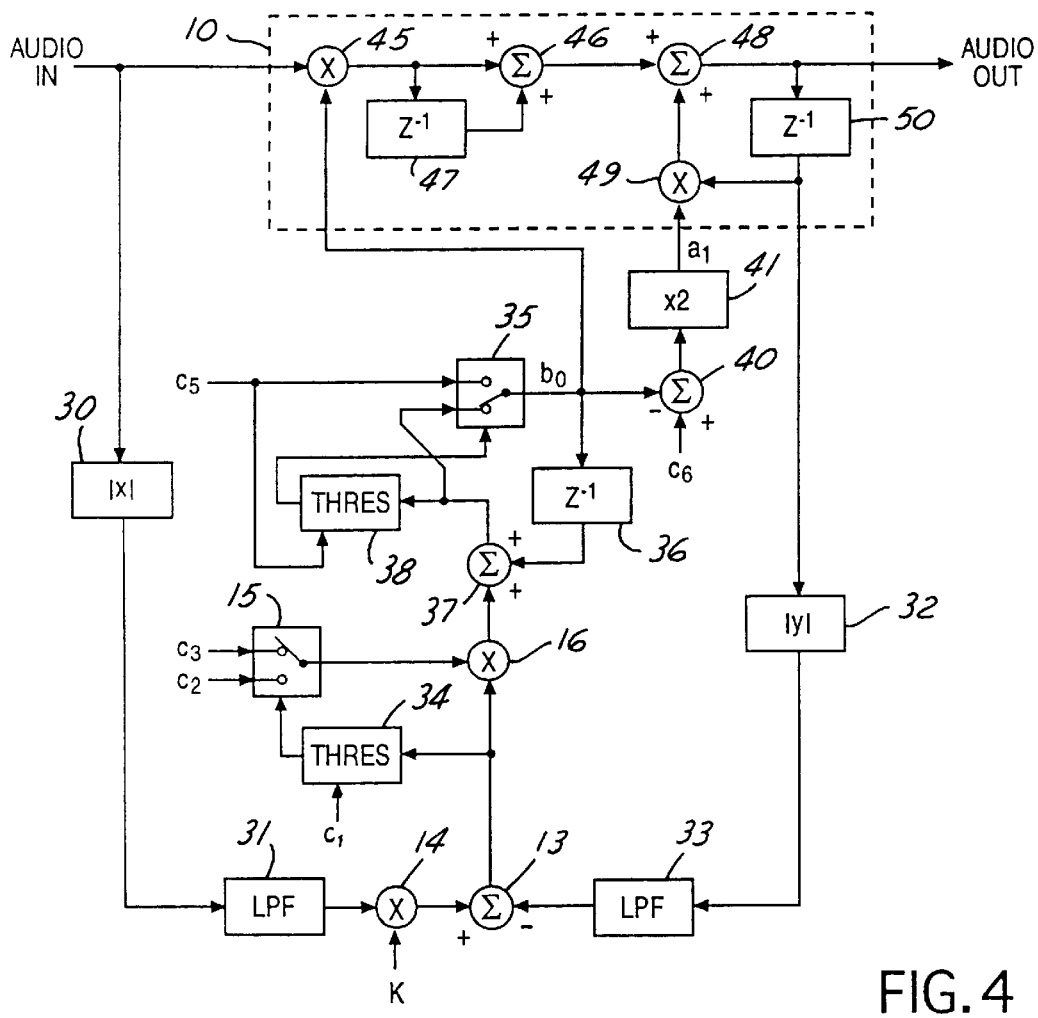
FIG. 4 is a block diagram showing the adaptive noise reduction filter in greater detail.

As shown in FIG. 4, filter coefficient $b_0$ is obtained at the output of a multiplexer 35. Coefficient $b_0$ is delayed through a $z^{-1}$ unit delay block 36 and then applied to one input of a summer 37. A second input of summer 37 receives the adaptation delta from multiplier 16 so that coefficient $b_0$ can be updated according to the adaptive value of delta. The output of summer 37 is coupled to the input of a threshold block 38 and to one input of multiplexer 35. Threshold block 38 compares the output of summer 37 (i.e., the updated value of coefficient $b_0$) to a constant $c_5$ representing the minimum frequency to which the upper cutoff frequency of the filter should be lowered. In other words, $c_5$ represents a lower adaptation limit value for coefficient $b_0$. Constant $c_5$ is also coupled to the remaining input of multiplexer 35. The output of threshold block 38 controls multiplexer 35 to select the updated value of coefficient $b_0$ from summer 37 unless the $b_0$ would fall below constant $c_5$, in which case multiplexer 35 is switched to select the minimum value $c_5$.

In order to obtain coefficient $a_1$, the current value of $b_0$ is coupled to a subtracting input of a summer 40. An adding input of summer 40 receives a constant $c_6$ which is preferably equal to 0.5. The output of summer 40 is doubled in an doubling block 41 to provide coefficient $a_1$ at its output.

Adaptive filter 10 includes a multiplier 45 for multiplying coefficient $b_0$ and the current value of the audio input signal $x_n$. The output of multiplier 45 is connected to a summing input of summer 46 and to a second input of summer 46 through a unit delay block 47. The output of summer 46 is connected to a summing input of summer 48. Filter coefficient $a_1$ is provided to one input of a multiplier 49. The output of summer 48 is applied to a second input of multiplier 49 through a unit delay block 50. Thus, filter 10 implements the second order IIR filter equation specified above. In the embodiment shown, the input to the output averager (i.e., to absolute value block 32) is shown as being derived from the output of delay block 50 (i.e., the filter output delayed by one sample). Deriving a signal for absolute value block 32 at this point may be more convenient for a particular DSP implementation; however, the signal could equally well be derived from the input to delay block 50 (i.e., the current sample).

Figure 5:
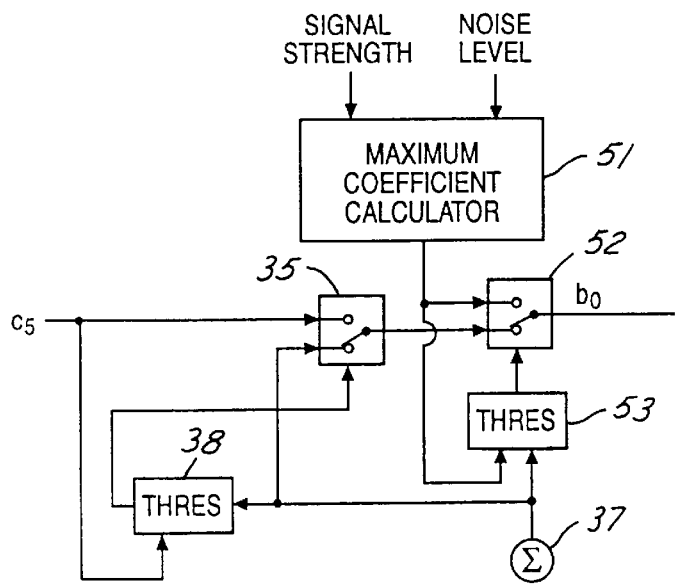
FIG. 5 is a block diagram showing additional features to provide a high frequency cut function under poor received signal conditions.

FIG. 5 shows a further improvement of the present invention for providing an upper adaptation limit for the filter coefficients so that the upper cutoff frequency of the filter is not adapted above a high cut frequency determined according to other detected properties of the audio signal. In particular, this improvement relates to use of the invention in a radio receiver with a radio tuner receiving a broadcast signal having a received quality which may be degraded from time to time. Thus, if multipath noise or other distortion is present in the received broadcast signal, this can be determined by monitoring signal quality at the intermediate frequency (IF) stage of the radio tuner and a high cut frequency can be established for eliminating or reducing noise in the audio output. Thus, a maximum coefficient calculator 51 receives a radio tuner signal-strength signal and a noise level detector signal from the radio tuner (not shown). The high cut frequency is determined in a conventional manner and then converted to a maximum coefficient value which is coupled to one input of a multiplexer 52 and to one input of a threshold block 53. Multiplexer 52 has a second input receiving the output from multiplexer 35 and provides at its output the value of coefficient $b_0$. Threshold block 53 receives the updated coefficient value from summer 37 which is compared to the upper adaptation limit and controls multiplexer 52 accordingly. Thus, if an certain upper adaptation limit is established due to the presence of noise or a loss of signal strength, then the updated coefficient value will be compared to the upper adaptation limit and if the updated coefficient value would raise the upper cutoff frequency of the filter to above the high cut frequency, then multiplexer 52 is switched to select the upper adaptation limit for the value of coefficient $b_0$.

Figure 6:
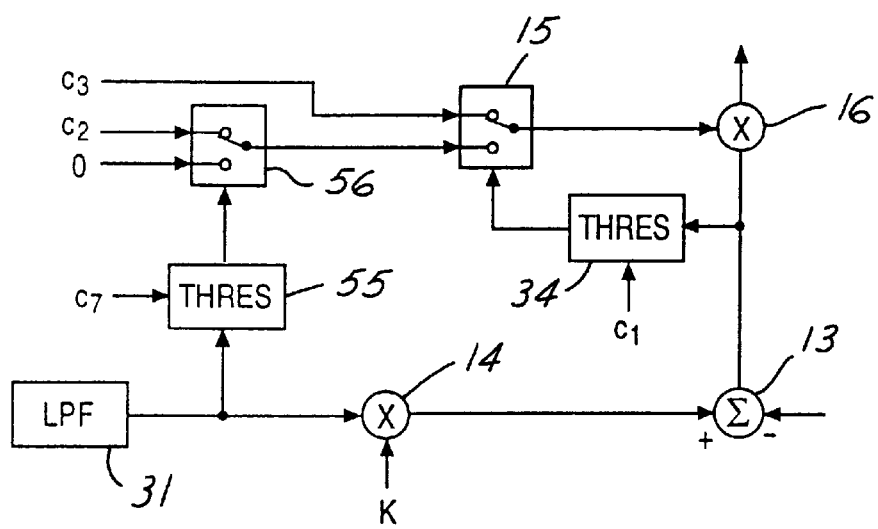
FIG. 6 is a block diagram showing an improvement for handling signals received at a low modulation level.

Particularly when the audio signal is derived from a radio tuner, filter adaptation may become unable to follow the actual broadcast signal content and may begin adapting to the noise signal under low signal modulation conditions. To avoid that situation, FIG. 6 shows an improved adaptation scheme for detecting the presence of low input modulation and halting at least a portion of the adaptation. Thus, the average input signal value from lowpass filter 31 is compared to a low modulation threshold constant $c_7$ in a threshold block 55. Constant $c_7$ is preferably set to a level of about 1% modulation (i.e., 1% of the maximum signal level). If modulation is greater than this threshold, then threshold block 55 controls a multiplexer 56 to provide normal attack time constant $c_2$ to the input of multiplexer 15. If modulation is below this threshold, then multiplexer 56 is switched to provide a value of zero as the attack time constant to the input of multiplexer 15. As a result, reductions in the upper cutoff frequency are disabled during low modulation so that the bandwidth remains wide enough to pass whatever input signal may be present.

What is claimed is:

1. A method for dynamic noise reduction of an audio signal in an audio reproduction system comprising the steps of:

lowpass filtering said audio signal in an adaptive lowpass filter having a plurality of filter coefficients to control an upper cutoff frequency of said lowpass filter;

time averaging an input audio signal at an input to said adaptive lowpass filter to obtain an input average;

time averaging an output audio signal at an output from said adaptive lowpass filter to obtain an output average;

multiplying one of said averages by a percentage constant;

forming a difference between said multiplied average and the other one of said averages to obtain an error using a time constant;

adapting said filter coefficients to cancel said error;

comparing said input average with a low modulation threshold; and inhibiting at least a portion of said adapting step if said input average is below said low modulation threshold.

2. The method of claim 1 wherein said time constant is comprised of either an attack time constant or a decay time constant, and wherein said attack time constant is larger than said decay time constant, said adapting step further comprising:

selecting one of said attack time constant or said decay time constant in response to the sign of said error; and setting said attack time constant to zero when inhibiting said adapting step.

3. The method of claim 1 wherein said low modulation threshold is substantially equal to about 1% of a maximum signal magnitude.

4. An adaptive noise reduction filter in a digital signal processing audio system reproducing an audio signal comprising:

an adaptive lowpass filter receiving an input audio signal and producing an output audio signal, said adaptive lowpass filter having a plurality of filter coefficients to control an upper cutoff frequency of said lowpass filter;

input averaging means coupled to said input audio signal for producing an input average;

output averaging means coupled to said output audio signal for producing an output average;

error means coupled to said input and output averaging means for multiplying one of said averages by a percentage constant and for forming a difference between said multiplied average and the other one of said averages to obtain an error;

adaptation means for adapting said filter coefficients to cancel said error;

comparing means for comparing said input average with a low modulation threshold; and inhibiting means for inhibiting at least a portion of said adapting step if said input average is below said low modulation threshold.

* * * * *